United States Patent
Wang et al.

(10) Patent No.: US 10,263,031 B2
(45) Date of Patent: Apr. 16, 2019

(54) FEEDBACK CAPACITOR AND METHOD FOR READOUT OF HYBRID BONDED IMAGE SENSORS

(71) Applicant: OmniVision Technologies, Inc., Santa Clara, CA (US)

(72) Inventors: Rui Wang, San Jose, CA (US); Hiroaki Ebihara, San Jose, CA (US); Zheng Yang, San Jose, CA (US); Chun-Ming Tang, San Jose, CA (US); Chao-Fang Tsai, Nantou (TW); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 149 days.

(21) Appl. No.: 15/421,911

(22) Filed: Feb. 1, 2017

(65) Prior Publication Data

US 2018/0220095 A1  Aug. 2, 2018

(51) Int. Cl.
| | |
|---|---|
| *H01J 40/14* | (2006.01) |
| *H01L 27/146* | (2006.01) |
| *H04N 5/3745* | (2011.01) |
| *H04N 5/369* | (2011.01) |

(52) U.S. Cl.
CPC .. *H01L 27/14641* (2013.01); *H01L 27/14612* (2013.01); *H01L 27/14634* (2013.01); *H01L 27/14636* (2013.01); *H01L 27/14643* (2013.01); *H04N 5/379* (2018.08); *H04N 5/3745* (2013.01); *H04N 5/37457* (2013.01)

(58) Field of Classification Search
CPC ......... H01L 27/14634; H01L 27/14636; H01L 27/14638; H04N 5/37457

USPC .................... 250/208.1, 214.1; 257/444, 459
See application file for complete search history.

(56) References Cited

U.S. PATENT DOCUMENTS

| | | |
|---|---|---|
| 6,504,141 B1 | 1/2003 | Kozlowski et al. |
| 6,902,987 B1 | 6/2005 | Tong et al. |
| 9,064,769 B2 | 6/2015 | Kozlowski |
| 9,998,698 B1 * | 6/2018 | Xue .................. H01L 27/14634 |

(Continued)

OTHER PUBLICATIONS

Chen et al. (2009) "An Efficient BScan-Sample-Based ΣΔ Beamformer for Medical Ultrasound Imaging," IEEE Biomedical Circuits and Systems Cont. 285-288.

(Continued)

*Primary Examiner* — Kevin K Pyo
(74) *Attorney, Agent, or Firm* — Lathrop Gage LLP

(57) ABSTRACT

A hybrid-bonded image sensor has a photodiode die with multiple macrocells; each macrocell has at least one photodiode and a coupling region. The coupling regions couple to a coupling region of a macrocell unit of a supporting circuitry die where they feed an input of an amplifier and a feedback capacitor. The feedback capacitor also couples to output of the amplifier, and the amplifier inverts between the input and the output. The method includes resetting a photodiode of the photodiode die; coupling signal from photodiode through the bond point to the supporting circuitry die to a feedback capacitor and to an input of the amplifier, the feedback capacitor also coupled to an inverting output of the amplifier; and amplifying the signal with the amplifier, where a capacitance of the feedback capacitor determines a gain of the amplifier.

12 Claims, 4 Drawing Sheets

(56) References Cited

U.S. PATENT DOCUMENTS

| | | |
|---|---|---|
| 2014/0054443 A1 | 2/2014 | Faramarzpour et al. |
| 2014/0211056 A1 | 7/2014 | Fan |

OTHER PUBLICATIONS

Xu "High-Speed Highly Sensitive CMOS Image Sensors," Ph.D. Thesis Defense, Hong Kong University of Science and Technology. 1-152.

Xu et al. (Oct. 2014) "A 1/2.5-inch VGA 400-fps CMOS Image Sensor with High Sensitivity," IEEE J. Solid-State Circuits. 49(1):2342-2351.

Xu et al. (Jun. 2012) "A 1500 fps Highly Sensitive 256×256 CMOS Imaging Sensor with In-Pixel Calibration," IEEE J. Solid-State Circuits. 47(6):1408-1418.

Xu et al. (2009) "Characterization and Analysis of Intra-Body Communication Channel," Int. Symp. Antennas and Propagation Soc. 1-4.

Xu et al. (2009) "Circuit-Coupled FEM Analysis of the Electric-Field Type Intra-Body Communication Channel," IEEE Biomedical Circuits and Systems Conf. 221-224.

Xu et al. (Sep. 2012) "Digitally Calibrated 768kS/s 1 O-bit Minimum-size SAR ADC Array with Dithering," IEEE J. Solid-State Circuits. 47(9):2129-2140.

Xu et al. (Mar. 2011) "Electric-Field Intrabody Communication Channel Modeling with Finite Element Method," IEEE Trans. Biomed. Eng. 58(3):705-712.

Xu et al. (Jul. 2012) "Equation Environment Coupling and Interference on the Electric-Field Intrabody Communication Channel," IEEE Trans. Biomed. Eng. 59(7):2051-2059.

Yuan et al. (Jan. 2012) "An Interpolation-Based Calibration Architecture for Pipeline ADC with Nonlinear Error," IEEE Trans. Instrum. Meas. 61(1):17-25.

Yuan et al. (Mar. 2012) "A 12-bit 20MS/s 56.3mW pipelined ADC with interpolation-based nonlinear calibration," IEEE Trans. Circuits Syst. I, Reg. Papers. 59(3):555-565.

Zhu et al. (2009) "High Speed Intra-Body Communication for Personal Health Care," IEEE Int. Conf. Eng. Med. Biol. Soc. 709-712.

Taiwan Patent Application No. 107103316, English translation of Office Action dated Jan. 8, 2019, 4 pages.

* cited by examiner

US 10,263,031 B2

FEEDBACK CAPACITOR AND METHOD FOR READOUT OF HYBRID BONDED IMAGE SENSORS

BACKGROUND

CMOS rectangular-array photosensor arrays are commonly used as image sensors in cameras. These arrays have an array of N by M (when N and M are both greater than 1 and often are unequal) photodiode-based photosensors each having at least one selection transistor having a gate coupled to a selection line. These arrays typically have precharge transistors arranged so to apply charge to the photodiode, and one or more sense transistors arranged to read post-exposure charge from the photodiode onto one or more bit lines; these arrays typically also have decoder-drivers configured to drive the selection lines and gain amplifiers fed by the bit lines, and in some embodiments may incorporate other circuitry.

Traditionally, photodiodes of photosensor arrays are read onto a bit line, sometimes through a unity-gain source-follower. The bit line is in turn multiplexed onto a gain amplifier. Gain amplifiers typically have gain controlled by a ratio of two resistors or two capacitors that provide feedback around the amplifier.

SUMMARY

In an embodiment, a hybrid-bonded device having an image sensor array has a photodiode die with multiple macrocells, where each macrocell has at least one photodiode and a coupling region. The coupling regions are coupled to a supporting circuitry die having macrocell units with a bond coupling region coupled to an input of an amplifier and to a first plate of a feedback capacitor coupled to the input of the amplifier. A second plate of the feedback capacitor is coupled to an output of the amplifier, and the amplifier inverts between the input and its output.

In another embodiment, a method of amplifying a signal from a photodiode of a photodiode die includes resetting a photodiode of the photodiode die; coupling a signal from the photodiode to a bond coupling region, the bond coupling region coupled to a bond coupling region of a supporting circuitry die; coupling the signal through the bond coupling region of the supporting circuitry to a first plate of a feedback capacitor and to an input of an amplifier, where a second plate of the feedback capacitor is coupled to an inverting output of the amplifier; and amplifying the signal with the amplifier, where capacitance of the feedback capacitor determines a gain of the amplifier.

DETAILED DESCRIPTION OF THE EMBODIMENTS

Figure 1:
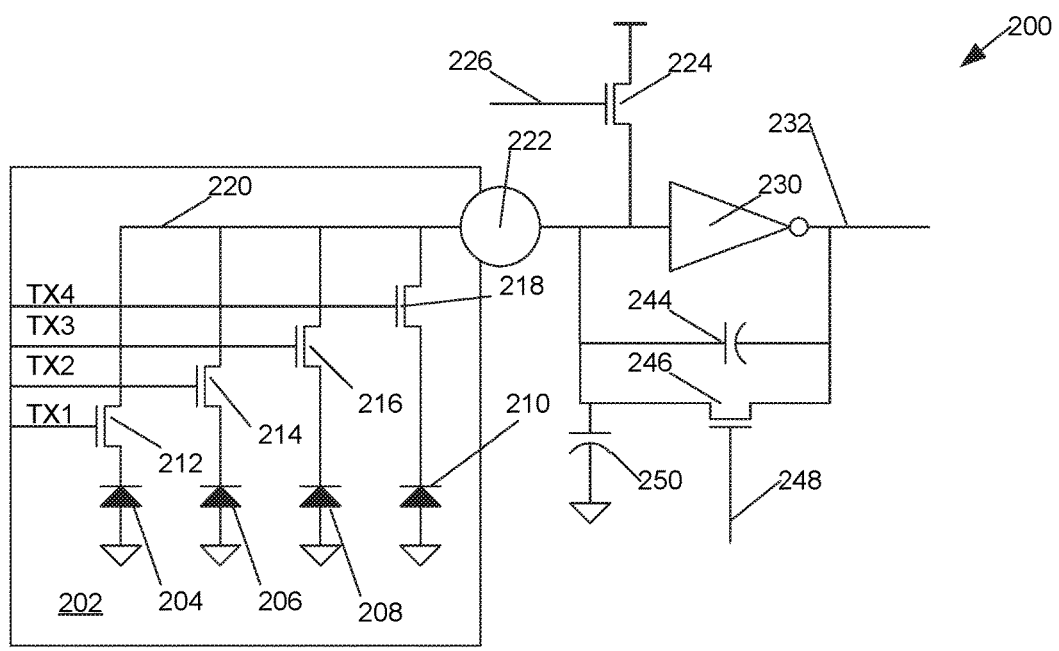
FIG. 1 is a schematic diagram of a macrocell in a hybrid bonded image sensor array, showing a photodiode-die macrocell, an inter-die bond, amplification circuitry, and a column multiplexor.

Typical CMOS image sensors have reset and selection transistors, decoder-drivers, buffers, gain amplifiers, and photodiodes all fabricated in the same monolithic integrated circuit substrate. This necessarily requires reserving some active area near each photodiode for the transistors, as well as associated interconnect such as the selection and bit lines. As cameras become smaller, to fit in thin devices like cell phones, and the market demands larger pixel counts, less and less surface area is allowed for each photodiode. Since signal levels depend on photons received by each photodiode, it is desirable to maximize the proportion of image-sensor area devoted to the photodiodes to maintain sensitivity.

Silicon is the semiconductor material most commonly used for CMOS electronic circuitry. While other semiconductor materials give improved sensitivity at specific wavelengths, it can be difficult to design and fabricate decoders, sense amplifiers, and other circuitry in those materials. For example, photodiodes fabricated of gallium arsenide (GaAs), gallium indium phosphide (GaInP), indium gallium arsenide (InGaAs) and germanium (Ge) may respond to wavelengths longer than those wavelengths of light silicon photodiodes typically respond to. Image sensors responsive to long wavelength, infrared, light may be useful in military and security systems, while those using silicon photodiodes are commonly used in cell phones, and visible-light cameras.

We have determined relocating a gain amplification stage within an image sensor array from after column multiplexors to bit lines, or to groups of rows within a column; for purposes of this document a column with gain amplification, or a group of rows of within a column that has gain amplification, is a supercell.

An image sensor is built from two separately-fabricated integrated circuit die bonded together to form a structure having two active layers, a photodiode layer fabricated from silicon or from another semiconductor material, such as germanium, gallium arsenide, indium gallium arsenide, gallium nitride, mercury telluride, or indium phosphide, selected according to the wavelengths for which the image sensor is intended for use, and a supporting circuitry layer fabricated in a monolithic silicon CMOS process. The supporting circuitry layer includes amplifiers, multiplexors, and similar circuits and, in some embodiments, analog to digital conversion and digital image processing circuitry as well.

Pixel-level bond architecture typically involves photodiode die with a small number, such as two, four, eight, or sixteen, of photodiodes associated with each bond contact provided for electrical connection between the photodiode die and the supporting circuitry die.

Integrated circuits typically have a front side, a surface of a wafer into which implants have been made to create regions such as transistor source and drain, gate oxide grown, upon which polysilicon for gates was deposited, and on which at least one level of metal interconnect was deposited. Integrated circuits also have a backside, opposite the front side. Backside-illuminated (BSI) photodiode die are those thinned and configured for incoming light to penetrate the backside of the circuit die to reach photodiodes of the die. Front side illuminated (FSI) photodiode die are those configured for light to reach photodiodes through the front side of the circuit die. In a particular embodiment of the present system, BSI photodiode die are used and are bonded to the supporting circuitry die.

The pixel-level bond architecture, with photodiodes on a different die than the die having supporting circuitry, not only permits using a greater percentage of photodiode-die area for photodiodes, but permits optimizing processing and materials of the photodiode die for photodiodes, while optimizing processing of the supporting circuitry die for the supporting CMOS circuitry.

In an alternative embodiment, a similar multilayer structure is formed by depositing a second semiconductor layer over integrated circuitry formed in a first integrated circuit die, the first integrated circuit die having the supporting circuitry, and the photodiodes formed in the second semiconductor layer. In either embodiment, an electrical connections made between each macrocell having a small group of photodiodes from interconnect of the active layer or integrated circuit die in which the photodiode is fabricated (the photodiode die) to interconnect of the integrated circuit die of the supporting circuitry (the support circuitry die). Photodiode die macrocells typically have one, two, four, or eight photodiodes.

For purposes of this document, a pixel-level bonded image sensor has one or more bonds for every macrocell having two, four, eight, or sixteen photodiodes. In a particular embodiment, the bond-per-pixel image sensor has a bond for every macrocell having four photodiodes. Further, in a particular embodiment, the photodiode die is a backside-illuminated die, where the die has a top surface into which photodiodes were fabricated and upon which interconnect is formed, and a backside opposite the top surface.

FIG. 1, Sensing

In an embodiment, a 4-photodiode macrocell 200 has a photodiode macrocell 202 with four photodiodes, 204, 206, 208, and 210. Alternative embodiments have 2, 4, 8 or 16 photodiodes per macrocell. Each photodiode 204, 206, 208, 210 is coupled through a transfer transistor 212, 214, 216, 218 respectively, to a macrocell data line 220, the transfer transistors 212, 214, 216, 218 are controlled by transfer lines TX1, TX2, TX3, and TX4 respectively. Macrocell data line 220 is coupled from the photodiode die to the support circuitry by a bond contact 222, in the support circuitry die macrocell data line 220 couples to a macrocell reset device 224 controlled by a reset line 226; in operation one or more transfer transistors of transfer transistors 212-218 are enabled by a photodiode transfer line TX1-4 while reset device 224 is activated by reset line 226 to apply a black-level voltage to a photodiode of photodiodes 204-210 during a reset phase; after the reset phase completes the reset and photodiode transfer enable lines are driven low to disable the transfer transistors 212-218 and the photodiodes 204-210 are exposed to light for an exposure time to accumulate photocurrent thereby reducing voltage on the photodiode—the reduced voltage forms an image. In a particular embodiment, all four transfer transistors are enabled simultaneously to reset all four photodiodes 204-210. In alternative embodiments, the transfer transistors are sequentially activated by TX1-4 lines to reset the photodiodes.

Macrocell data line 220 also couples to an inverting input of an amplifier 230, amplifier 230 has output 232. During operation, after photodiodes 204-210 have been reset and exposed to light for the exposure time, reset device 224 disabled. A photodiode transfer enable line of photodiode transfer lines TX1-4 is activated to enable reading a photodiode. An image-dependent voltage on the selected photodiode of photodiodes 204-210 is then amplified in amplifier 230 by a gain dependent on a ratio of a feedback capacitor 244 coupled from amplifier 230 output 232 to input at bond contact 222, and a second gain control capacitor 250 that may be a parasitic capacitance or may have specific capacitor components. A reset transistor 246, controlled by a reset control line 248, is provided to zero charge between readings of photodiodes.

Figure 2:
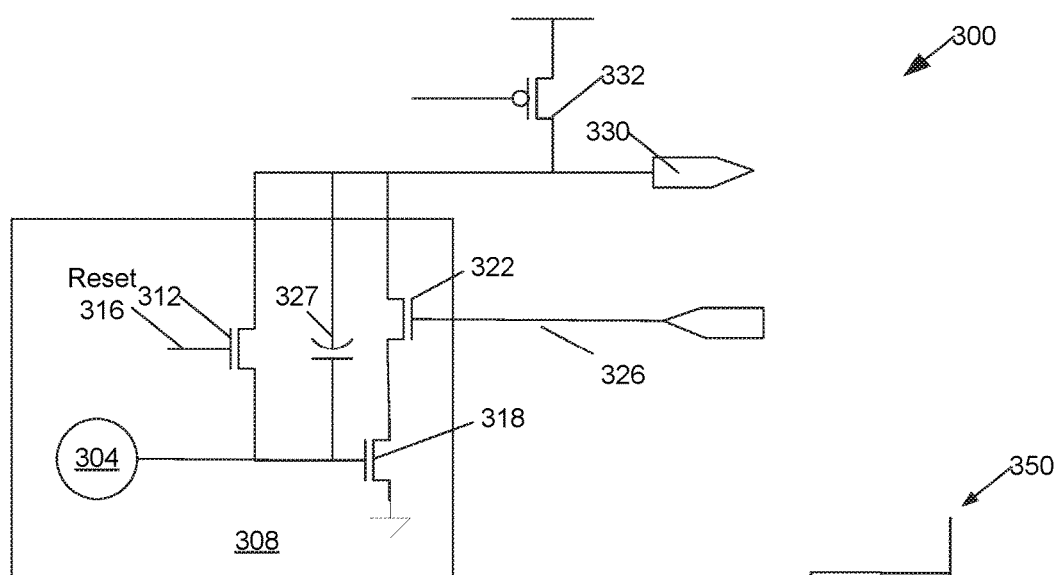
FIG. 2 is a schematic diagram of an embodiment of amplification circuitry in an embodiment.

FIG. 2, Common Source Amplifier

In an alternative embodiment 300 (FIG. 2), incorporating one or more macrocells, each macrocell of the photodiode die (not shown for simplicity, similar to that of FIG. 1) bonds to a bond contact 304 in a three-transistor macrocell unit 308 of the support circuitry die. Each macrocell unit 308 also has a Reset transistor 312 controlled by a Reset control line Reset 316, Reset control line 316 may in some embodiments be common to all macrocell units of embodiment 300, and in other embodiments Reset control line 316 is separate for each macrocell unit 300 but is common across multiple columns of macrocells. Also within macrocell unit 308 is an amplifier transistor 318 having gate connected to bond contact 304, the amplifier 318 being coupled in series with a cascode and selection transistor 322. Each cascode and selection transistor has gate connected to a separate macrocell selection line 326 and drain connected to a common macrocell output line 330. Each macrocell unit also has a feedback and gain-setting capacitor 327 the second gain setting capacitor may be a parasitic capacitance or may include a capacitor in addition to parasitic capacitance. A load and precharge transistor 332 provides a common load for amplifier transistors 318.

During read operations of photodiodes coupled to a particular macrocell unit 308, the macrocell selection line 326 of that macrocell unit is driven to a high level, while all selection lines of other macrocells are driven low to deselect those macrocells. The amplifier input transistor 318 of the selected macrocell 308 thus becomes an inverting input of an amplifier formed of selected input transistor 318 and load transistor 332. A feedback capacitor 327 is provided from common source amplifier output line 330 to bond contact 304.

Figure 3:
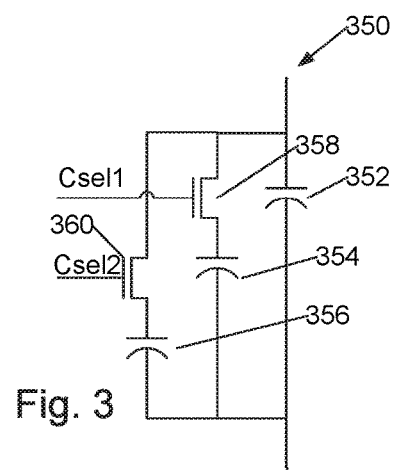
FIG. 3 is a schematic diagram illustrating a configurable-capacitance gain control capacitor.

Wherever a gain-controlling feedback capacitor such as feedback capacitor 244, 327, or second gain capacitor 250 to ground, is specified herein, the capacitor may be a configurable-capacitance capacitor 350 as illustrated schematically in FIG. 3. The configurable-capacitance capacitor has a small fixed capacitor 352 providing a minimum capacitance value, and several controllable capacitors 354, 356 that may be coupled in parallel with fixed capacitor 352 through selection transistors 358, 360. The selection transistors 358, 360 are controlled by capacitance control lines Csel1 and Csel2, allowing control lines Csel1 and Csel2 to configure capacitance of the configurable-capacitance capacitor. In embodiments where both feedback capacitor 244 and second gain capacitor 250 are configurable-capacitance capacitors, amplifier 230 may be configured to have any one of a wide selection of predetermined gains.

In an alternative embodiment, the amplifier is a differential amplifier.

Distributed Differential Amplifiers

Figure 4:
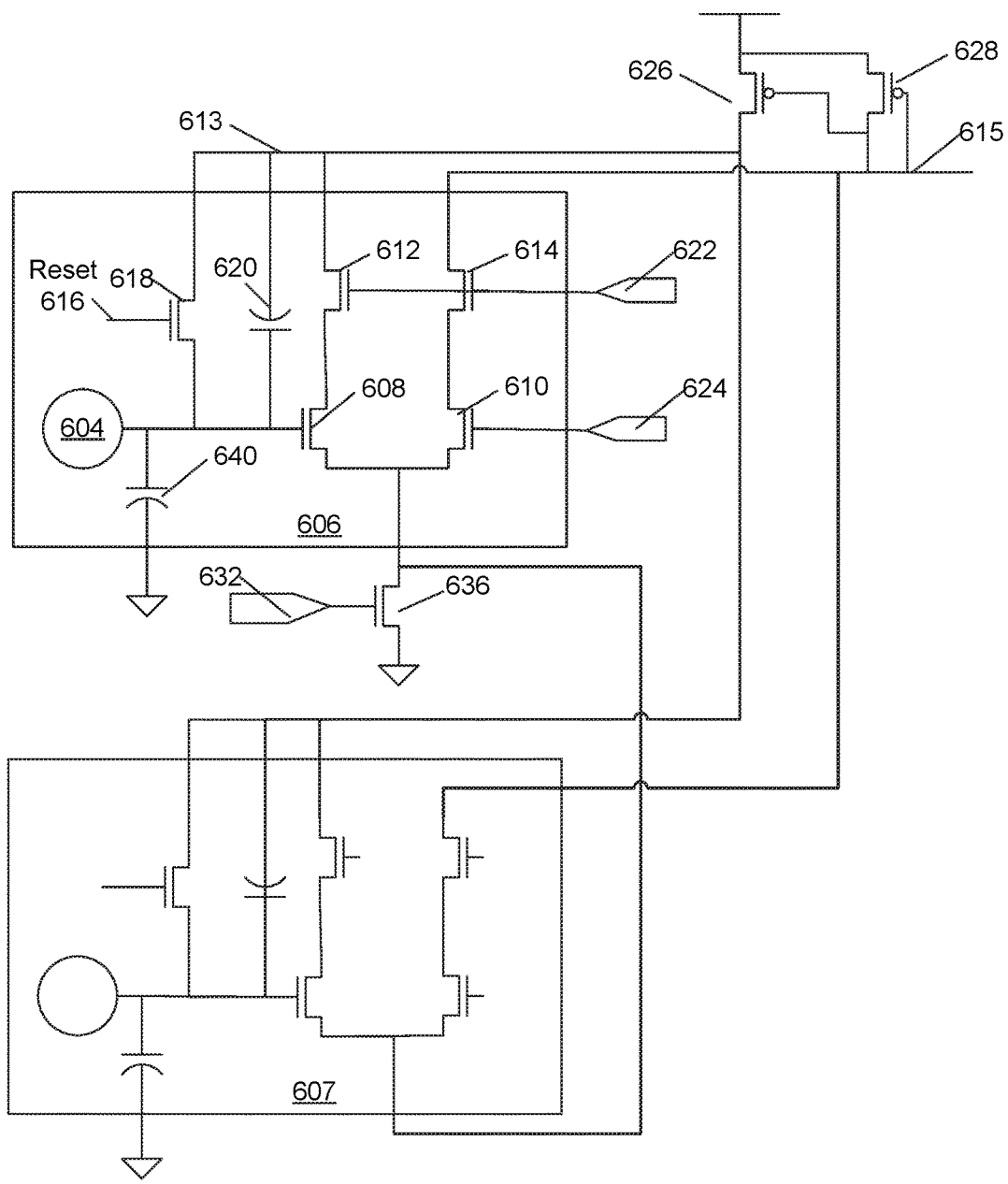
FIG. 4 is a schematic diagram illustrating an embodiment having a distributed differential amplifier with a portion in each macrocell unit of the supporting circuitry die.

As shown in FIG. 4, a distributed differential amplifier may be used with the feedback capacitor herein described. In a particular embodiment, bond contact 604 couples data line 220 of a photodiode-die macrocell 202 into a supporting circuitry die macrocell unit 606. A second macrocell unit 607 is illustrated to show how multiple macrocell units may interconnect. The macrocell unit 606 is equipped with a reset transistor 618 controlled by a reset control line 616 adapted for use in resetting photodiodes of the photodiode die and resetting the differential amplifier. Bond contact 604 is coupled to a gate of an input transistor 608 of the differential amplifier, and a second input transistor 610 has gate coupled to a global reference 624. Feedback capacitor 620 is provided between bond contact 604 and an inverting output common load bus 613 of the amplifier.

Each input transistor is coupled through a cascode and selection transistor 612 and 614, to common load buses 613, 615 for multiple macrocell units. Cascode and load transistors 612, 614 are controlled by a row selection signal 622. An active load is provided on common load busses 613, 615, and is formed of P-devices 626, 628. A common current source transistor 636, controlled by a current source bias signal 632, is provided for all macrocell units coupled to common load busses 613, 615.

Gain is controlled by a ratio of feedback capacitor 620 and a second capacitor 640, second capacitor may in some embodiments be a parasitic capacitor and in other embodiments a capacitor may be provided to supplement parasitic capacitance as part of capacitor 640.

In the embodiment of FIG. 4, bond contact 604, transistors 618, 612, 610, 614, 608, and capacitors 620, 640, form part of the repeated macrocell unit 606, while remaining components of FIG. 4 are parts of a supercell incorporating multiple macrocell units.

Figure 5:
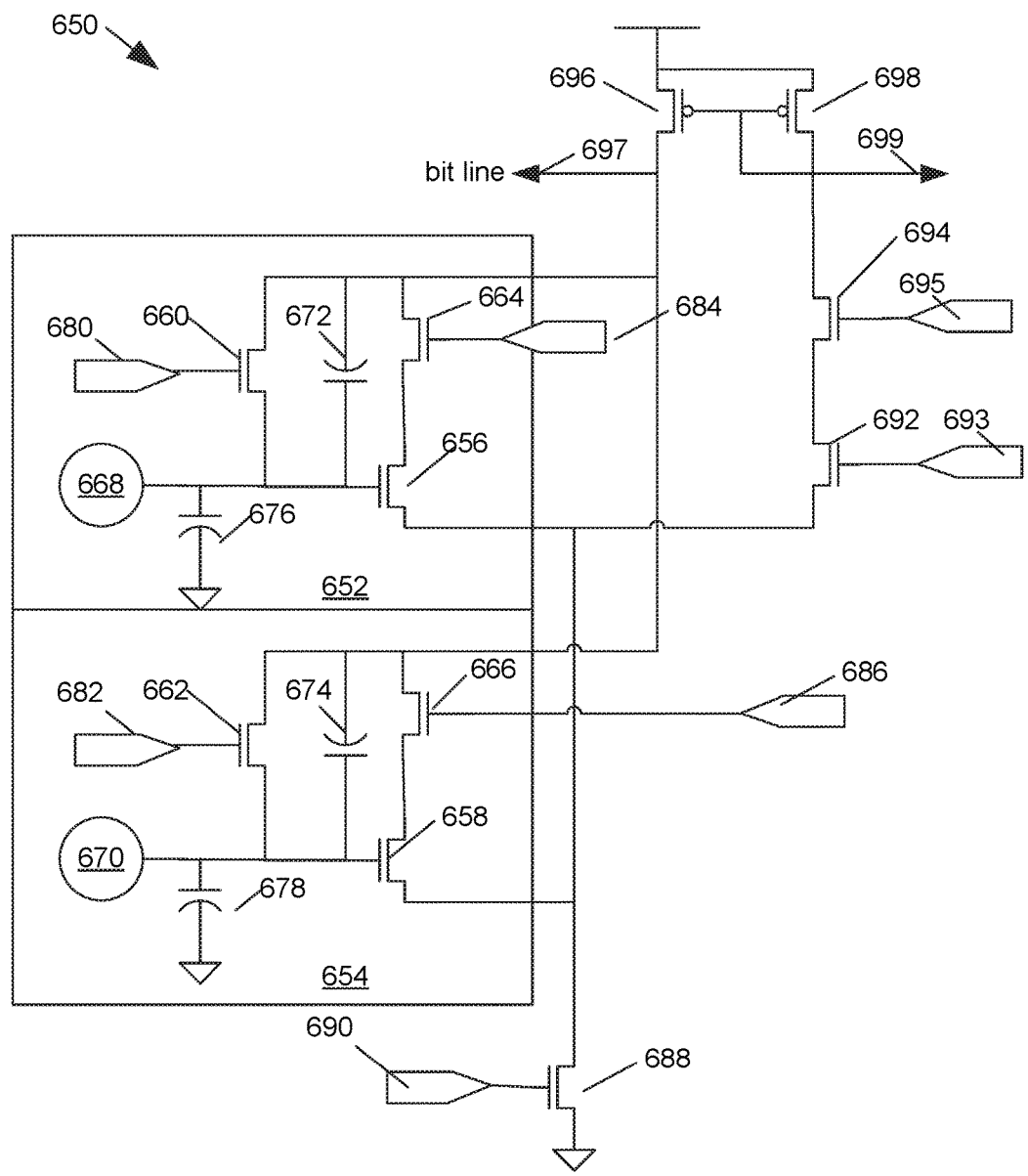
FIG. 5 is a schematic diagram of an alternative embodiment having a distributed differential amplifier with a portion in each macrocell unit of the supporting circuitry die.

An alternative distributed differential amplifier macrocell is illustrated in FIG. 5. This embodiment 650 features macrocells 652, 654, each of which has three transistors; an input transistor 656, 658, a reset or precharge transistor 660, 662, and a load transistor 664, 666 as well as a bond contact 668, 670. Each macrocell has a gain-setting feedback capacitor 672, 674 as herein described, feedback capacitor 672, 674 may be a fixed-value capacitor or may have a configurable value to permit adjustment of gain. Gain is set by the gain of the differential amplifier and the ratio of feedback capacitor 672, 674, to a second gain setting capacitor 676, 678 that, as previously described with reference to capacitors 640, 250, may be partially or entirely parasitic. Either or both of feedback capacitor 672, 674, or second gain setting capacitor 676, 678 may be a configurable capacitor as heretofore described.

Each macrocell 652, 654 have a reset input 680, 682 that activates precharge transistors and selection and bias input 684, 686, that, when high, makes the macrocell active for reading of photodiodes.

Multiple macrocells 652, 654 form a part of a supercell, having other components of the distributed differential amplifier, including a current source transistor 688 having gate coupled to a reference signal 690 and drain coupled to input transistors 656, 658 of each macrocell 652, 654, and to a noninverting input transistor 692 of the distributed differential amplifier, transistor 692 is external to the macrocells, has gate tied to a reference signal 693, and coupled in series with a cascode and load transistor 694 having gate tied to a bias signal 695. The dummy selection transistor 694 and read selection transistors 664, 666, couple to an active load formed of P-channel transistors 696, 698 and drive amplifier outputs 697, 699.

Applicant notes that in all embodiments illustrated, there is an inversion between the amplifier input coupled to the bond contact and a first side or plate of the feedback capacitor, and the amplifier output coupled to the second side or plate of the amplifier. Embodiments illustrated include inverting common source and differential amplifier topologies.

Combinations

Features described herein may be present in different combinations within a single camera system. Among combinations of features anticipated are common-source or differential amplifiers with fixed or configurable feedback capacitors, with strictly parasitic, fixed value, or configurable second gain setting capacitors, and with capacitors of gate, metal-to metal, metal-to-poly, or lateral types. Additional combinations include:

A hybrid bonded image sensor designated A including a photodiode die having a plurality of macrocells, where each macrocell has at least one photodiode and a bond contact; a supporting circuitry die comprising at least one macrocell unit, each macrocell unit having at least one bond contact bonded to the bond contact of a macrocell of the photodiode die, the bond contact of the macrocell unit of the supporting circuitry die being coupled to an input of an amplifier, and a first plate of a feedback capacitor coupled to the input of the amplifier. A second plate of the feedback capacitor is coupled to an output of the amplifier, wherein the amplifier inverts between the input and the output.

A hybrid bonded image sensor designated AA including the hybrid bonded image sensor designated A wherein the amplifier is a common-source amplifier. The hybrid bonded image sensor of claim 2 wherein there are 2, 4, 8 or 16 photodiodes per photodiode-die macrocell.

A hybrid bonded image sensor designated AB including the hybrid bonded image sensor designated A or AA wherein the feedback capacitor has configurable capacitance.

A hybrid bonded image sensor designated AC including the hybrid bonded image sensor designated A, or AA wherein the amplifier is a differential amplifier.

A hybrid bonded image sensor designated AD including the hybrid bonded image sensor designated A, AA, AB, or AC wherein there are 2, 4, 8 or 16 photodiodes per photodiode-die macrocell.

A hybrid bonded image sensor designated AE including the hybrid bonded image sensor designated A, AA, AB, AC, or AD wherein the feedback capacitor has configurable capacitance, including at least a first capacitor, a second capacitor, and a selection transistor coupled in series with the second capacitor.

A method of amplifying a signal from a photodiode of a photodiode die designated B includes resetting a photodiode of the photodiode die; coupling a signal from the photodiode to a bond point, the bond point coupled to a bond point of a supporting circuitry die; coupling the signal through the bond point of the supporting circuitry to a first plate of a feedback capacitor and to an input of an amplifier, where a second plate of the feedback capacitor is coupled to an inverting output of the amplifier; and amplifying the signal with the amplifier, where a capacitance of the feedback capacitor determines a gain of the amplifier.

A method of amplifying a signal from a photodiode of a photodiode die designated BA including the method designated B and further including where the amplifier includes a common source amplifier.

A method of amplifying a signal from a photodiode of a photodiode die designated BB including the method designated B and further including wherein the amplifier comprises a differential amplifier.

A method of amplifying a signal from a photodiode of a photodiode die designated BC including the method designated BB, BA, or B and further including wherein the capacitance of the feedback capacitor is determined by a capacitance selection signal, and further comprising configuring the capacitance selection signal.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A hybrid bonded image sensor comprising:
a photodiode die comprising a plurality of macrocells, where each macrocell comprises at least one photodiode and a contact;
a supporting circuitry die comprising at least one macrocell unit, each macrocell unit comprising at least one contact electrically coupled to the contact of a macrocell of the photodiode die, the coupling point of the macrocell unit of the supporting circuitry die coupled to an input of an amplifier,
a first plate of a feedback capacitor coupled to the input of the amplifier, wherein a second plate of the feedback capacitor is coupled to an output of the amplifier,
wherein the amplifier inverts between the input and the output; and
the feedback capacitor has configurable capacitance, being comprised of at least a first capacitor, a second capacitor, and a selection transistor coupled in series with the second capacitor.

2. The hybrid bonded image sensor of claim 1 wherein the amplifier is a common-source amplifier.

3. The hybrid bonded image sensor of claim 2 wherein there are 2, 4, 8 or 16 photodiodes per photodiode-die macrocell.

4. The hybrid bonded image sensor of claim 2 wherein the feedback capacitor has configurable capacitance.

5. The hybrid bonded image sensor of claim 1 wherein the amplifier is a differential amplifier.

6. The hybrid bonded image sensor of claim 5 wherein there are 2, 4, 8 or 16 photodiodes per photodiode-die macrocell.

7. The hybrid bonded image sensor of claim 5 wherein the feedback capacitor has configurable capacitance.

8. The hybrid bonded image sensor of claim 1 wherein there are 2, 4, 8 or 16 photodiodes per photodiode-die macrocell.

9. A method of amplifying a signal from a photodiode of a photodiode die comprising:
resetting a photodiode of the photodiode die;
coupling a signal from the photodiode to a contact, the contact coupled to a contact of a supporting circuitry die;
coupling the signal through the contact of the supporting circuitry to a first plate of a feedback capacitor and to an input of an amplifier, where a second plate of the feedback capacitor is coupled to an inverting output of the amplifier; and amplifying the signal with the amplifier, where a capacitance of the feedback capacitor determines a gain of the amplifier;
where the feedback capacitor has configurable capacitance, being comprised of at least a first capacitor, a second capacitor, and a selection transistor coupled in series with the second capacitor.

10. The method of claim 9 where the amplifier comprises a common source amplifier.

11. The method of claim 9 wherein the amplifier comprises a differential amplifier.

12. The method of claim 9 wherein the capacitance of the feedback capacitor is determined by a capacitance selection signal, and further comprising configuring the capacitance selection signal to determine gain of the amplifier.

* * * * *